US011852583B2

(12) United States Patent
Park et al.

(10) Patent No.: US 11,852,583 B2
(45) Date of Patent: Dec. 26, 2023

(54) APPARATUS AND METHOD FOR MEASURING PHASE OF EXTREME ULTRAVIOLET (EUV) MASK AND METHOD OF FABRICATING EUV MASK INCLUDING THE METHOD

(71) Applicant: Samsung Electronics Co., Ltd., Suwon-si (KR)

(72) Inventors: Jongju Park, Hwaseong-si (KR); Raewon Yi, Suwon-si (KR); Hakseung Han, Hwaseong-si (KR); Seongsue Kim, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 18/179,662

(22) Filed: Mar. 7, 2023

(65) Prior Publication Data

US 2023/0236124 A1    Jul. 27, 2023

Related U.S. Application Data

(63) Continuation of application No. 17/036,855, filed on Sep. 29, 2020, now Pat. No. 11,635,371.

(30) Foreign Application Priority Data

Mar. 19, 2020    (KR) .................. 10-2020-0034057

(51) Int. Cl.
*G01N 21/41*    (2006.01)
*G01N 21/956*    (2006.01)
(Continued)

(52) U.S. Cl.
CPC ............... *G01N 21/41* (2013.01); *G01J 9/00* (2013.01); *G01N 21/956* (2013.01); *G03F 1/22* (2013.01);
(Continued)

(58) Field of Classification Search
CPC ......... G01J 9/00; G01N 21/41; G01N 21/956; G01N 2021/335; G01N 2021/95676;
(Continued)

(56) References Cited

U.S. PATENT DOCUMENTS

| | | | |
|---|---|---|---|
| 6,982,796 B2 | 1/2006 | Sato | |
| 7,408,646 B2 | 8/2008 | Rau et al. | |
| 8,138,483 B2 | 3/2012 | Lee et al. | |
| 8,953,869 B2 | 2/2015 | Nasser-Ghodsi et al. | |

(Continued)

FOREIGN PATENT DOCUMENTS

| JP | 2003227914 A | 8/2003 |
|---|---|---|
| JP | 5279280 B2 | 5/2013 |

(Continued)

*Primary Examiner* — Mark R Gaworecki
(74) *Attorney, Agent, or Firm* — Myers Bigel, P.A.

(57) ABSTRACT

An apparatus and a method for correctly measuring a phase of an extreme ultraviolet (EUV) mask and a method of fabricating an EUV mask including the method are described. The apparatus for measuring the phase of the EUV mask includes an EUV light source configured to generate and output EUV light, at least one mirror configured to reflect the EUV light as reflected EUV light incident on an EUV mask to be measured, a mask stage on which the EUV mask is arranged, a detector configured to receive the EUV light reflected from the EUV mask, to obtain a two-dimensional (2D) image, and to measure reflectivity and diffraction efficiency of the EUV mask, and a processor configured to determine a phase of the EUV mask by using the reflectivity and diffraction efficiency of the EUV mask.

12 Claims, 13 Drawing Sheets

(51) Int. Cl.
  *G03F 1/22*  (2012.01)
  *G03F 1/84*  (2012.01)
  *G03F 1/24*  (2012.01)
  *G01J 9/00*  (2006.01)
  *G01N 21/33* (2006.01)

(52) U.S. Cl.
  CPC ............... *G03F 1/24* (2013.01); *G03F 1/84* (2013.01); *G01N 2021/335* (2013.01); *G01N 2021/95676* (2013.01); *G01N 2201/061* (2013.01); *G01N 2201/0636* (2013.01)

(58) Field of Classification Search
  CPC ...... G01N 2201/061; G01N 2201/0636; G03F 1/22; G03F 1/24; G03F 1/54; G03F 1/84
  See application file for complete search history.

(56) References Cited

U.S. PATENT DOCUMENTS

| | | |
|---|---|---|
| 9,719,859 B2 | 8/2017 | Kusunose et al. |
| 2011/0240863 A1 | 10/2011 | Lee et al. |
| 2017/0221194 A1 | 8/2017 | Ebstein |
| 2018/0284600 A1 | 10/2018 | Steigerwald et al. |
| 2019/0331611 A1 | 10/2019 | Ebstein |
| 2020/0124957 A1 | 4/2020 | Jaiswal |

FOREIGN PATENT DOCUMENTS

| | | |
|---|---|---|
| JP | 5725681 B1 | 4/2015 |
| JP | 5846681 B2 | 12/2015 |
| KR | 1020110110578 | 10/2011 |
| KR | 101272039 B1 | 6/2013 |
| KR | 101484937 B1 | 1/2015 |
| KR | 1020180120864 | 11/2018 |
| WO | 2018007211 A1 | 1/2018 |

APPARATUS AND METHOD FOR MEASURING PHASE OF EXTREME ULTRAVIOLET (EUV) MASK AND METHOD OF FABRICATING EUV MASK INCLUDING THE METHOD

CROSS-REFERENCE TO RELATED APPLICATION

This application is a continuation of U.S. patent application Ser. No. 17/036,855, filed Sep. 29, 2020, which application claims the benefit of Korean Patent Application No. 10-2020-0034057, filed on Mar. 19, 2020, in the Korean Intellectual Property Office, the disclosures of which are incorporated by reference herein in their entireties.

BACKGROUND

The inventive concept relates to an extreme ultraviolet (EUV) mask, and more particularly, to an apparatus and a method for measuring the phase of the EUV mask.

A lithography process is a technology having considerable influence on miniaturization of a semiconductor device. Research into a light source with a shorter wavelength is being performed in order to overcome the resolution limit in the lithography process. Recently, an EUV lithography process using EUV light is being developed. The EUV light is scattered in a medium such as a material or air and is absorbed well into most materials. Therefore, during an exposure process, instead of a transmissive mask, a reflective mask is used. On the other hand, when inspection or metrology equipment applied to the transmissive mask is applied to the reflective mask, the resolution or defect detecting sensitivity may not be satisfactory. In particular, when inspection or metrology equipment actually using EUV light is not used, it may be difficult to satisfy a required specification during fabrication of a mask.

SUMMARY

The inventive concept relates to an apparatus and a method for correctly measuring a phase of an extreme ultraviolet (EUV) mask and a method of fabricating an EUV mask including the method.

According to an aspect of the inventive concept, there is provided an apparatus for measuring the phase of the EUV mask, including an EUV light source configured to generate and output EUV light, at least one mirror configured to reflect the EUV light as reflected EUV light incident on an EUV mask to be measured, a mask stage on which the EUV mask is arranged, a detector configured to receive the EUV light reflected from the EUV mask, to obtain a two-dimensional (2D) image, and to measure reflectivity and diffraction efficiency of the EUV mask, and a processor configured to calculate or determine a phase of the EUV mask by using the reflectivity and diffraction efficiency of the EUV mask.

According to an aspect of the inventive concept, there is provided an apparatus for measuring the phase of the EUV mask, including an EUV light source configured to generate and output EUV coherent light, at least one mirror configured to reflect the EUV coherent light as reflected EUV coherent light into an EUV mask to be measured, a mask stage on which the EUV mask is arranged, a detector configured to receive the EUV coherent light reflected from the EUV mask, to obtain a two-dimensional (2D) image, and to measure reflectivity and diffraction efficiency of the EUV mask, and a processor configured to calculate or determine a phase of the EUV mask by using the reflectivity and diffraction efficiency of the EUV mask. The EUV mask includes a first mask pattern area for measuring reflectivity and a second mask pattern area for measuring diffraction efficiency.

According to an aspect of the inventive concept, there is provided a method of measuring the phase of an EUV mask, including measuring reflectivity of a multilayer of a first mask pattern area of an EUV mask to be measured using a phase measuring apparatus, measuring reflectivity of an absorber layer of the first mask pattern area using the phase measuring apparatus, measuring diffraction efficiency of patterns of an absorber layer of a second mask pattern area of the EUV mask using the phase measuring apparatus, and calculating or determining a phase of the EUV mask using the reflectivity of each of the multilayer and the absorber layer of the first mask pattern area and the diffraction efficiency of the patterns of the absorber layer of the second mask pattern area.

According to an aspect of the inventive concept, there is provided a method of fabricating an EUV mask, including fabricating a first EUV mask, measuring reflectivity of a multilayer of a first mask pattern area of a second EUV mask to be measured using a phase measuring apparatus, measuring reflectivity of an absorber layer of the first mask pattern area using the phase measuring apparatus, measuring diffraction efficiency of patterns of an absorber layer of a second mask pattern area of the second EUV mask using the phase measuring apparatus, calculating a phase of the first EUV mask using the reflectivity of each of the multilayer and the absorber layer and the diffraction efficiency of the patterns of the absorber layer, determining whether the calculated phase is in an allowable range, and completing fabrication of the first EUV mask when the phase is in the allowable range.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
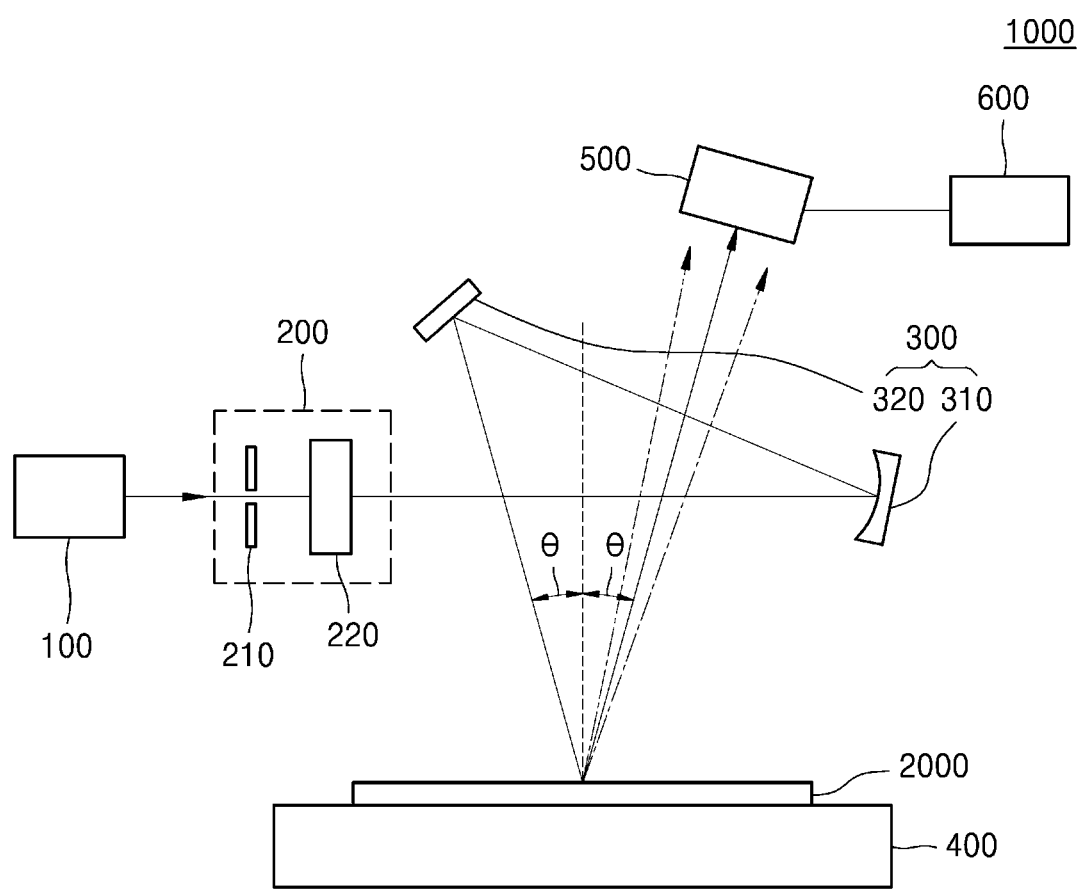
FIG. 1 is a block diagram schematically illustrating an apparatus for measuring a phase of an extreme ultraviolet (EUV) mask according to an embodiment of the inventive concept.

Hereinafter, embodiments of the inventive concept will be described in detail with reference to the accompanying drawings. Like reference numerals refer to like elements throughout and previously given description thereof may be omitted.

FIG. 1 is a block diagram schematically illustrating an apparatus 1000 for measuring a phase of an extreme ultraviolet (EUV) mask according to an embodiment of the inventive concept.

Referring to FIG. 1, the apparatus 1000 for measuring the phase of the EUV mask (hereinafter, referred to as 'a phase measuring apparatus') according to the current embodiment may include an EUV light source 100, a coherence unit or coherence system 200, a mirror unit or mirror system 300, a mask stage 400, a detector 500, and a processor 600.

The EUV light source 100 may be an apparatus for generating and outputting EUV light and may generate and output, in particular, EUV light of 13.5 nm. For example, the EUV light source 100 may generate the EUV light through plasma discharge. Laser plasma, discharge plasma, or high temperature plasma may be used for the plasma discharge.

On the other hand, a femto-second laser apparatus may be used for the laser plasma. In more detail, the femto-second laser apparatus may include, for example, a femto-second titanium (Ti): sapphire laser apparatus. The femto-second Ti: sapphire laser apparatus may generate pulse laser light with a frequency of dozens of MHzs and may have a correlator connected thereto. The laser light from the femto-second laser apparatus may be irradiated into or onto a discharge chamber by using a focusing lens. In the discharge chamber, a plasma generating gas, for example, a neon gas may be stored. By irradiating the laser light onto the neon gas stored in the discharge chamber, plasma is generated and light with various wavelengths including the EUV light may be emitted from the plasma.

The coherence unit 200 may include a pin-hole plate 210 and a filter 220. The pin-hole plate 210 may be arranged at a rear end of the EUV light source 100 and may reduce the EUV light by a pin-hole size. In addition, the pin-hole plate 210 may improve spatial coherence of light so that the EUV light of the EUV light source 100 may become coherence light or coherent light. On the other hand, in the phase measuring apparatus 1000 according to the current embodiment, the pin-hole plate 210 is arranged between the EUV light source 100 and the filter 220. However, a position of the pin-hole plate 210 is not limited thereto. For example, according to an embodiment, the pin-hole plate 210 may be arranged at a rear end of the filter 220.

The filter 220 may selectively transmit only the EUV light among light components emitted from the EUV light source 100 and may remove the other light components. For example, light emitted from the EUV light source 100 first, that is, light emitted from the plasma may include light with various wavelengths such as EUV light or vacuum ultraviolet (VUV) light. Therefore, the filter 220 may have only the EUV light irradiated onto an EUV mask 2000 by blocking the other light components excluding the EUV light among the light components emitted from the EUV light source 100. The filter 220 may be considered as improving spectrum coherence of light.

The filter 220 may include, for example, a zirconium filter. On the other hand, EUV light output through the filter 220 may be EUV light having a center wavelength of 13.5 nm. For example, the filter 220 may include an X-ray mirror. The X-ray mirror may irradiate the EUV light with the center wavelength of 13.5 nm in the EUV light onto the EUV mask 2000. That is, the X-ray mirror may select the EUV light with the center wavelength of 13.5 nm and may irradiate the selected EUV light onto the EUV mask 2000 using the mirror unit 300.

On the other hand, according to an embodiment, the coherence unit 200 may further include a shutter arranged between the EUV light source 100 and the pin-hole plate 210 or between the EUV light source 100 and the filter 220. The shutter may control an amount of the EUV light irradiated onto the EUV mask 2000 by controlling an amount of the EUV light output from the EUV light source 100.

The mirror unit 300 may include a first mirror 310 and a second mirror 320. The first mirror 310 may condense the EUV light, and the second mirror 320 may direct the EUV light incident on the EUV mask 2000 at a predetermined angle. In the phase measuring apparatus 1000 according to the current embodiment, the first mirror 310 may be or include a concave mirror and the second mirror 320 may be or include a flat mirror. For example, the first mirror 310 may be or include a concave mirror such as a spherical mirror or an elliptical mirror.

Positions and functions of the first mirror 310 and the second mirror 320 will be described in more detail. The first mirror 310 may be arranged on the other side of the coherence unit 200 from the EUV light source 100 around the EUV mask 2000. In addition, the first mirror 310 that is the concave mirror may have a concave surface reflecting the EUV light and condensing the reflected EUV light onto the second mirror 320. Therefore, the EUV light may be incident on the first mirror 310 and then, may be reflected toward an upper space in which the second mirror 320 is arranged. In addition, the EUV light may be condensed through the first mirror 310 and may be incident on the second mirror 320. Specifically, for example, when the first mirror 310 is a spherical or elliptical mirror, the second mirror 320 may be arranged in a focus position of the spherical or elliptical mirror. Therefore, the EUV light incident on the first mirror 310 may be reflected from the first mirror 310 and may be condensed onto the second mirror 320 arranged in the focus position of the first mirror 310.

The second mirror 320 may be arranged in the upper space of the EUV mask 2000 (e.g., above the EUV mask 2000). For example, the second mirror 320 may be arranged in a position higher than the first mirror 310. However, according to an embodiment, the second mirror 320 may be arranged in a position lower than the first mirror 310. In addition, the second mirror 320 that is the flat mirror may have a plane reflecting the EUV light to the EUV mask 2000. Therefore, the EUV light incident from the first mirror 310 may be reflected by the second mirror 320 and may proceed toward an upper surface of the EUV mask 2000.

On the other hand, a slope angle of the second mirror 320 may be controlled so that an angle of incidence θ of the EUV light onto the upper surface of the EUV mask 2000 is 2° to (e.g., relative to vertical). In the phase measuring apparatus 1000 according to the current embodiment, the slope angle of the second mirror 320 may be controlled so that the angle of incidence θ of the EUV light is about 6°. Furthermore, light incident on the EUV mask 2000 may be diffracted and reflected due to patterns of an absorber layer formed on the upper surface of the EUV mask 2000. In FIG. 1, among light components reflected from the EUV mask 2000, a portion marked with a solid line may mean $0^{th}$ order diffracted light and a portion marked with a dashed line may mean first order diffracted light. In accordance with a shape of each of the patterns of the absorber layer formed on the upper surface of the EUV mask 2000, above second order diffracted light may be obtained.

The phase measuring apparatus 1000 according to the current embodiment may effectively irradiate the EUV light onto the EUV mask 2000 even in a narrow space due to layout structures of the first mirror 310 that is the concave mirror and the second mirror 320 that is the flat mirror.

The EUV mask 2000 to be measured may be arranged on the mask stage 400. The mask stage 400 may horizontally move on an X-Y plane and may vertically move on a Z axis according to an embodiment. According to two or three-dimensional movement of the mask stage 400, the EUV mask 2000 may also two or three-dimensionally move. According to an embodiment, the mask stage 400 may include a position sensor controlling a position or a measuring position of the EUV mask 2000.

The detector 500 detects the EUV light reflected and diffracted from the EUV mask 2000. The detector 500 as an apparatus capable of performing spatial decomposition may include a kind of imaging apparatus capable of obtaining a far-field diffracted image as a two-dimensional (2D) image. The imaging apparatus may collect a field spectrum of reflected light, may convert the reflected light into an electrical signal, and may output the electrical signal. For example, in the phase measuring apparatus 1000 according to the current embodiment, the detector 500 may include a charge coupled device (CCD) camera using an X-ray. However, the detector 500 is not limited to a CCD camera. For example, the detector 500 may include a photo-diode array (PDA) detector and a CMOS image sensor (CIS) camera.

The detector 500 may measure the reflectivity of each of a multilayer (refer to 2100 of FIG. 2A) and a first absorber layer (refer to 2200 of FIG. 2A) of the EUV mask 2000 and diffraction efficiency of a pattern of a second absorber layer (refer to 2200a of FIG. 2B) of the EUV mask 2000. The reflectivity of each of the multilayer and the first absorber layer and the diffraction efficiency of the pattern of the second absorber layer will be described in more detail with reference to FIGS. 4A to 4C.

The processor 600 may reconstruct imaging through a program based on imaging information received from the detector 500. In addition, the processor 600 may calculate the phase of the EUV mask based on the imaging information. Here, the imaging information may include the reflectivity of each of the multilayer and the first absorber layer of the EUV mask 2000 and the diffraction efficiency of the pattern of the second absorber layer of the EUV mask 2000. Therefore, the processor 600 may specifically calculate an absolute value of the phase of the EUV mask 2000 by using the reflectivity and the diffraction efficiency of the EUV mask 2000 to be measured. Phase calculation through the processor 600 will be described in more detail with reference to FIG. 5. On the other hand, the processor 600 may include an interface such as a personal computer (PC) so that a large amount of data from the detector 500 may be processed in a short time.

The phase measuring apparatus 1000 according to the current embodiment may measure the reflectivity of each of the multilayer and the absorber layer in a first mask pattern area of the EUV mask by using the EUV light and the detector such as the CCD camera, may receive the diffracted light in a second mask pattern area of the EUV mask, and may measure the diffraction efficiency of the diffracted light by using the reflectivity of the multilayer or intensity of the reflected light. In addition, the phase measuring apparatus 1000 according to the current embodiment may accurately measure the phase of the EUV mask by specifically calculating the absolute value of the phase of the EUV mask through the formula of the diffraction efficiency or a phase measuring algorithm based on the reflectivity of each of the multilayer and the absorber layer and the diffraction efficiency of the diffracted light. Therefore, the phase measuring apparatus 1000 according to the current embodiment may significantly contribute to improvement of quality of the EUV mask by providing correct phase information on the EUV mask.

For reference, since a current EUV mask with an absorber layer area with reflectivity of around 2% is not a perfect binary mask, it is necessary to manage the reflectivity and phase of the EUV mask. Here, the binary mask may mean a mask with a multilayer area with reflectivity of almost 100% and with an absorber layer area with reflectivity of almost 0. In addition, in an EUV phase shift mask (PSM) expected to be developed, the phase of the EUV mask is one of the very important factors defining the quality of the EUV mask. Conventional measurement equipment may not specifically measure the absolute value of the phase of the EUV mask. The phase measuring apparatus 1000 according to the current embodiment may correctly measure the phase of the EUV mask through the above-described components and a phase measuring algorithm and accordingly, may significantly contribute to the improvement of the quality of the EUV mask.

Figure 2A:
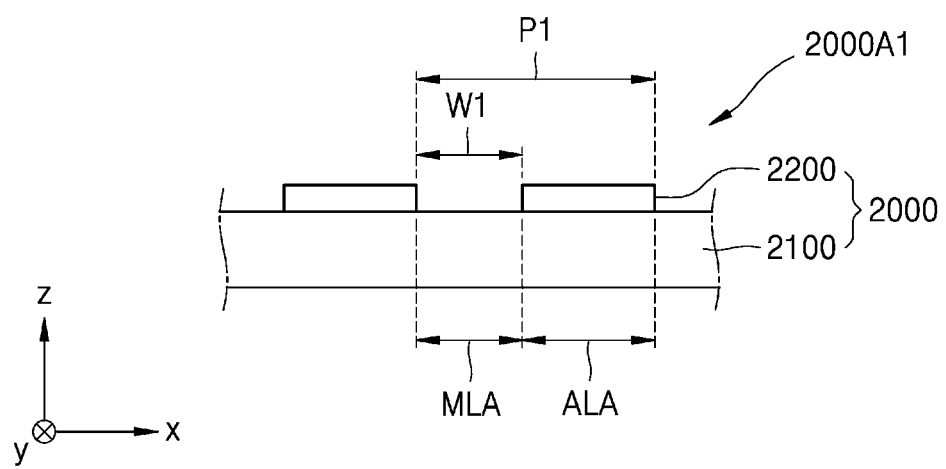
FIGS. 2A and 2B are cross-sectional views of an EUV mask to be measured by the apparatus for measuring the phase of the EUV mask of FIG. 1.
Figure 2B:
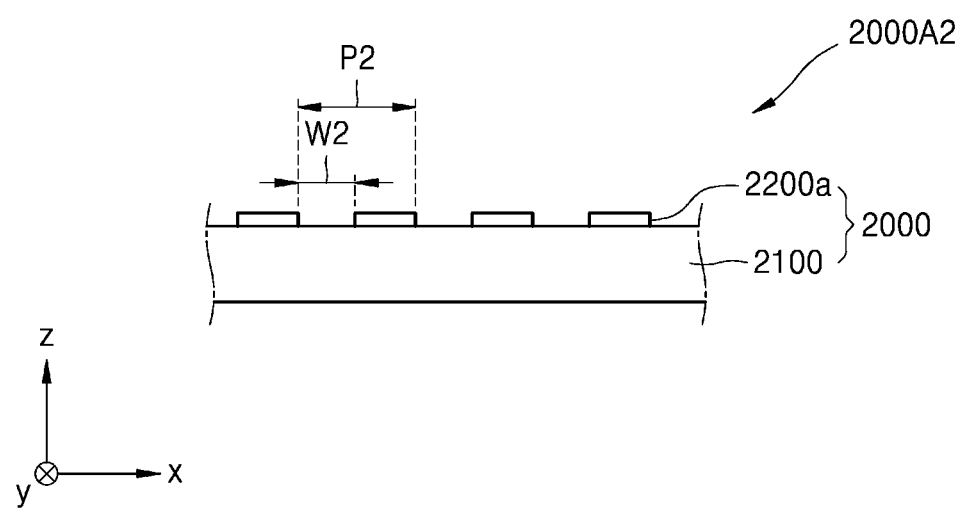

FIGS. 2A and 2B are cross-sectional views of the EUV mask 2000 to be measured by the apparatus for measuring the phase of the EUV mask of FIG. 1.

Referring to FIG. 2A, the EUV mask 2000 may include a first mask pattern area 2000A1. A first mask pattern area 2000A1 may include a multilayer 2100 and a first absorber layer 2200. The multilayer 2100 may have a structure in which two kinds of different material layers are alternately stacked. For example, the multilayer 2100 may have a structure in which a silicon (Si) layer and a molybdenum (Mo) layer are alternately stacked. In more detail, for example, the multilayer 2100 may be formed by stacking about 40 to 60 bilayers each including the Si layer and the Mo layer. In addition, each of the Si layer and the Mo layer that form the multilayer 2100 may have a thickness of about 3 nm and 4 nm.

On the other hand, the multilayer 2100 may be formed on a mask substrate such as a Si substrate or a quartz substrate. The EUV mask in a more detailed structure including the mask substrate will be described with reference to FIG. 3.

The first absorber layer 2200 may be arranged on the multilayer 2100. In addition, as illustrated in FIG. 2A, the first absorber layer 2200 with predetermined patterns may be arranged on the multilayer 2100. For example, the first absorber layer 2200 may have line and space patterns apart from each other in a first direction (an x direction) and extending in a second direction (a y direction). The pattern of the first absorber layer 2200 is not limited to the line and space pattern. The pattern of the first absorber layer 2200 may have repeatability so that a phase may be more easily calculated. However, the pattern of the first absorber layer 2200 does not necessarily have repeatability.

The first absorber layer 2200 absorbing the EUV light may be formed of tantalum nitride (TaN), Ta, titanium nitride (TiN), or Ti. However, a material of the first absorber layer 2200 is not limited to the above-described materials. On the other hand, although not shown, between the first absorber layer 2200 and the multilayer 2100, a capping layer may be present. The capping layer will be described in more detail with reference to FIG. 3.

In the apparatus 1000 for measuring the phase of the EUV mask according to the current embodiment, the first mask pattern area 2000A1 of the EUV mask 2000 may include the pattern of the first absorber layer 2200 at an mm level. That is, in the first mask pattern area 2000A1, when the first absorber layer 2200 in the line and space pattern is regularly repeated and a distance or space between the first absorber layers 2200 has a first width W1 and a first pitch P1 in the first direction (the x direction), each of the first width W1 and the first pitch P1 is about several mms and the first pitch P1 is greater than the first width W1 in accordance with the definition of a pitch.

Hereinafter, a portion between the first absorber layers 2200, in which the multilayer 2100 is exposed, is referred to as a multilayer area MLA and a portion of the first absorber layer 2200 is referred to as an absorber layer area ALA. Due to a characteristic in which the multilayer area MLA is bright and the absorber layer area ALA is dark, the multilayer area MLA is referred to as a clear area and the absorber layer area ALA is referred to as a dark area.

The first mask pattern area 2000A1 may be used for measuring reflectivity of the multilayer area MLA and reflectivity of the absorber layer area ALA. In general, reflectivity may be defined as the intensity of reflected light to the intensity of incident light. When a size of the pattern of the absorber layer and a distance between the absorber layers are very small, it may be difficult to measure correctly the reflectivity of each of the multilayer area MLA and the absorber layer area ALA. That is, when the reflectivity of the multilayer area MLA is measured, light generated by reflection, diffraction, and scattering in the absorber layer area ALA may be included in reflected light of the multilayer area MLA so that the reflectivity of the multilayer area MLA may be incorrectly measured. In addition, when the reflectivity of the absorber layer area ALA is calculated, the reflected light of the multilayer area MLA may affect the measurement or reflection from a side surface of the absorber layer may affect the measurement, and thus, the reflectivity of the absorber layer area ALA may be incorrectly measured.

Therefore, the above-described problem may be solved by forming the pattern of the first absorber layer 2200 of the first mask pattern area 2000A1 relatively large to be at the mm level. Therefore, the apparatus 1000 for measuring the phase of the EUV mask according to the current embodiment may correctly measure the reflectivity of each of the multilayer area MLA and the absorber layer area ALA by using the first mask pattern area 2000A1.

Referring to FIG. 2B, the EUV mask 2000 may include a second mask pattern area 2000A2 and the second mask pattern area 2000A2 may include the multilayer 2100 and second absorber layers 2200a. The second absorber layers 2200a may be different from the first absorber layer 2200 of the first mask pattern area 2000A1 in size. In more detail, the multilayer 2100 may be the same as described for the multilayer 2100 of the first mask pattern area 2000A1. On the other hand, a material or characteristic of the second absorber layers 2200a may be the same as described for the first absorber layer 2200 of the first mask pattern area 2000A1. However, a pattern of the second absorber layers 2200a may be different from the pattern of the first absorber layer 2200 of the first mask pattern area 2000A1 in that the pattern of the second absorber layers 2200a has a size at a inn level. For example, the second absorber layers 2200a in a line and space pattern may have a second width W2 of about several inns and a second pitch P2 of about several inns in the first direction (the x direction). In addition, in accordance with the definition of a pitch, the second pitch P2 is greater than the second width W2.

The second mask pattern area 2000A2 may be used for measuring the diffraction efficiency of the pattern of the absorber layer. The diffraction efficiency may be defined as the intensity of diffracted light in the pattern of the absorber layer to the intensity of the reflected light of the multilayer area MLA. In addition, the diffraction efficiency may be defined for each of 0th order diffracted light and higher order diffracted light components. That is, the diffraction efficiency of the $0^{th}$ order diffracted light may be defined as the intensity of the $0^{th}$ order diffracted light to the intensity of the reflected light of the multilayer area MLA and the diffraction efficiency of the first order diffracted light may be defined as the intensity of the first order diffracted light to the intensity of the reflected light of the multilayer area MLA.

The apparatus 1000 for measuring the phase of the EUV mask according to the current embodiment may actually measure the phase of the actual EUV mask and may correctly determine whether the phase of the actual EUV mask is defective by measuring the phase of the EUV mask 2000 by measuring the diffraction efficiency by using the second mask pattern area 2000A2 of the EUV mask 2000 including the pattern of the second absorber layer 2200a at the μm level.

For reference, a size of the pattern of the actual EUV mask may be at the nm level. It may be very complicated to calculate the diffraction efficiency of light of the actual EUV mask having the pattern of the absorber layer at the nm level and the phase of the actual EUV mask in accordance with the diffraction efficiency. However, considering a conceptual aspect of the phase of the EUV mask, when a thickness of the absorber layer is almost 0, a difference between the phase of the EUV mask having the pattern of the absorber layer at the iim level and the phase of the EUV mask having the pattern of the absorber layer at the nm level may not be large. Therefore, the apparatus 1000 for measuring the phase of the EUV mask according to the current embodiment may calculate the phase of the EUV mask 2000 by making the thickness of the second absorber layer 2200a almost 0 after calculating the diffraction efficiency of the second mask pattern area 2000A2 having the pattern of the second absorber layer 2200a at the inn level. The calculated phase of the EUV mask 2000 is similar to the phase of the actual EUV mask and may contribute to determining whether the phase of the actual EUV mask is defective.

Figure 3:
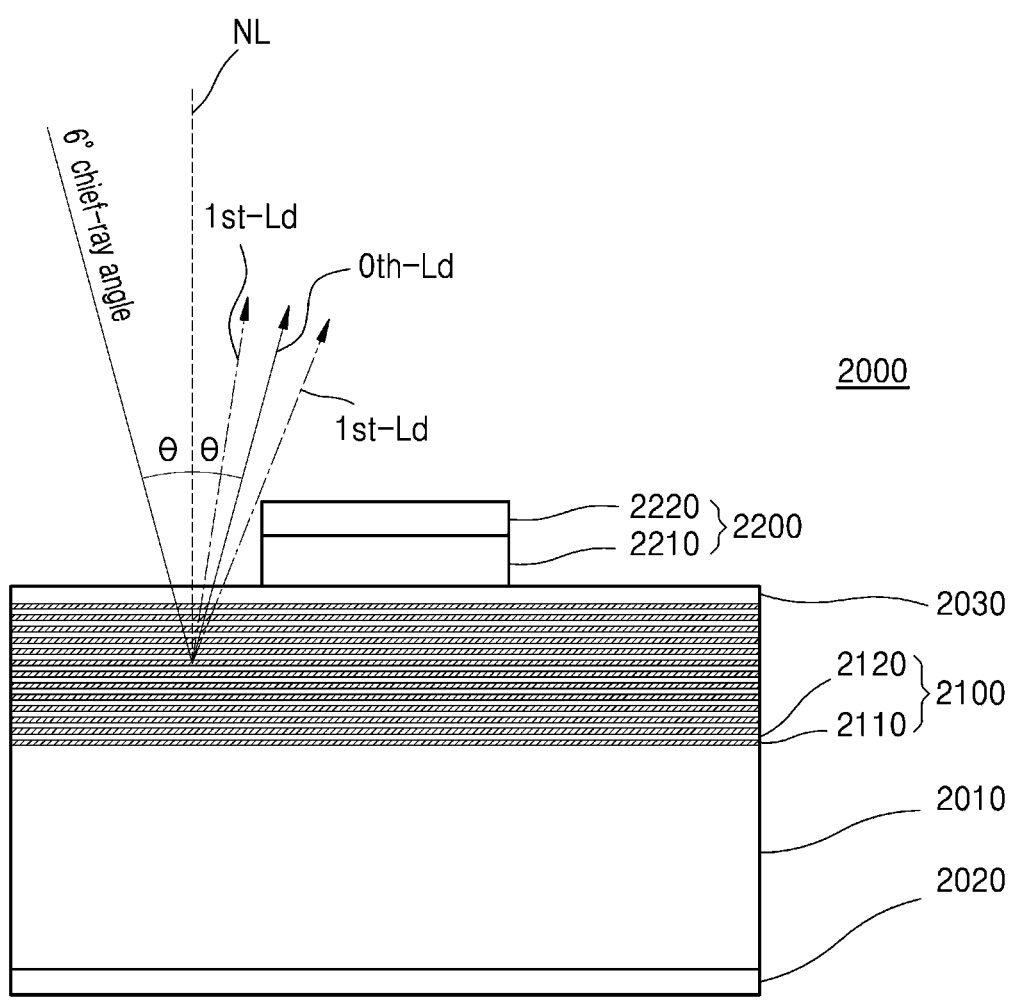
FIG. 3 is a cross-sectional view illustrating a structure of the EUV mask of FIG. 2A in more detail.

FIG. 3 is a cross-sectional view illustrating a structure of the EUV mask 2000 of FIG. 2A in more detail. Description previously given with reference to FIG. 2A will be omitted.

Referring to FIG. 3, the EUV mask 2000 may include a mask substrate 2010, a rear surface coating layer 2020, the multilayer 2100, a capping layer 2030, and the first absorber layer 2200. The mask substrate 2010 may be formed of a low thermal expansion material (LTEM). For example, the mask substrate 2010 may be or include a Si substrate or a quartz substrate.

The rear surface coating layer 2020 may be formed on a lower surface of the mask substrate 2010 and the multilayer 2100 may be formed on an upper surface of the mask substrate 2010. The rear surface coating layer 2020 may be formed of a conductive material such as a metal. The multilayer 2100 may include a plurality of alternately stacked Si layers 2120 and Mo layers 2110. The multilayer 2100 may be the same as described for the multilayer 2100 of the first mask pattern area 2000A1 of FIG. 2A.

The capping layer 2030 may be formed on the multilayer 2100. The first absorber layer 2200 may be formed on the capping layer 2030. That is, the capping layer 2030 may be between the first absorber layer 2200 and the multilayer 2100. The capping layer 2030 may include one or more material layers and may protect the multilayer 2100. For example, the capping layer 2030 may be formed of ruthenium (Ru). However, a material of the capping layer 2030 is not limited to Ru.

The first absorber layer 2200 may include an absorber body 2210 and an anti-reflective coating (ARC) layer 2220. The absorber body 2210 may be a layer absorbing the EUV light and may be formed of TaN, Ta, TiN, or Ti as described above. However, a material of the absorber body 2210 is not limited to the above-described materials. The ARC layer 2220 preventing incident EUV light from being reflected may be omitted according to an embodiment.

As illustrated in FIG. 3, the EUV light may be incident on the EUV mask 2000 with an angle of incidence of 6° and may be reflected with an angle of reflection of 6°. Here, the angle of incidence and the angle of reflection are defined with respect to a normal line NL perpendicular to the upper surface of the EUV mask 2000 and the normal line NL is marked with a dashed line in FIG. 3. The normal line NL may be a vertical line. In addition, the EUV light incident on the EUV mask 2000 may be diffracted due to the pattern of the first absorber layer 2200. In FIG. 3, 0th order diffracted light 0th-Ld marked with a solid line and first order diffracted light 1st-Ld marked with a dashed line are illustrated. Diffracted light may include above second order diffracted light.

Figure 4A:
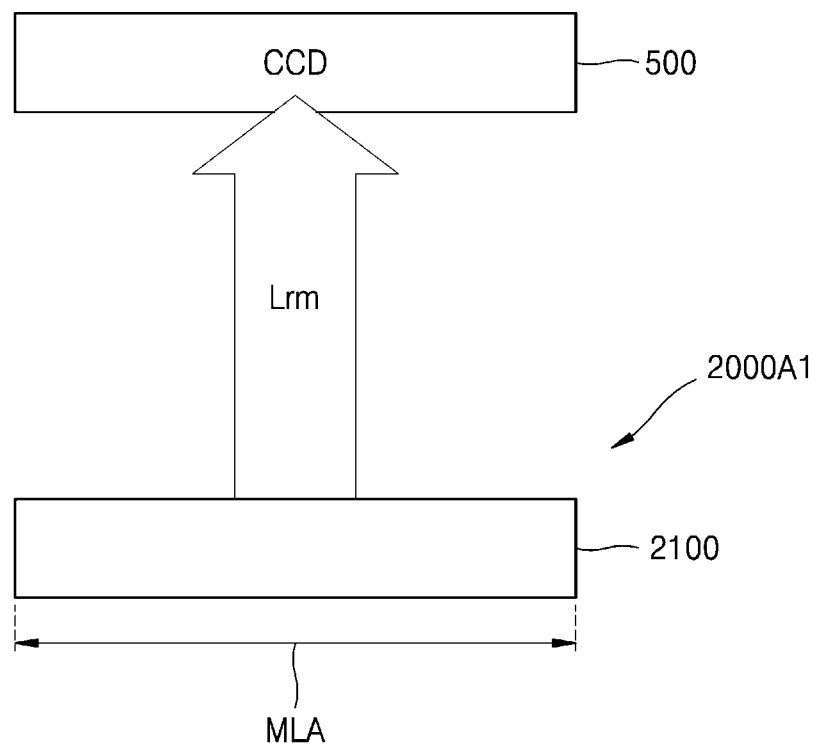
FIGS. 4A to 4C are conceptual diagrams illustrating a process of measuring a phase of an EUV mask by using the apparatus for measuring the phase of the EUV mask of FIG. 1.
Figure 4B:
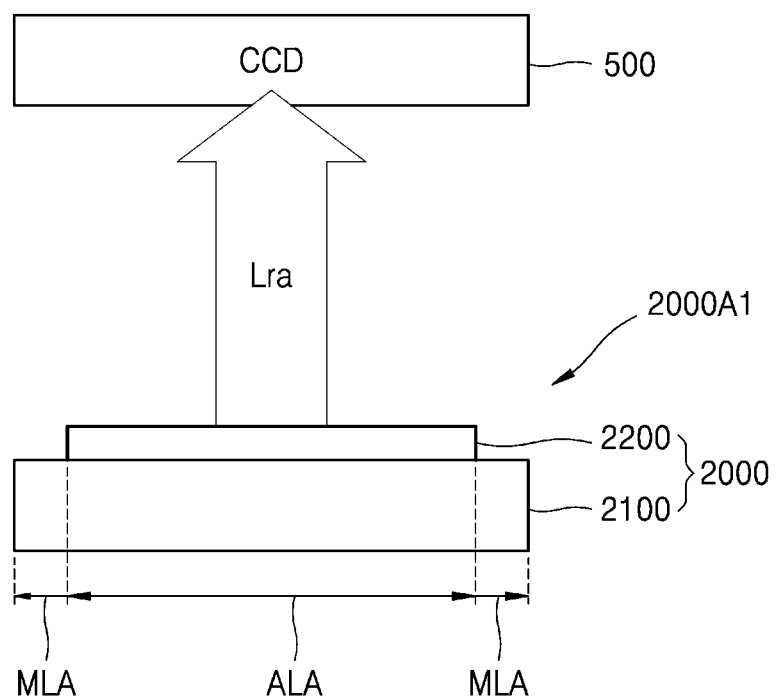
Figure 4C:
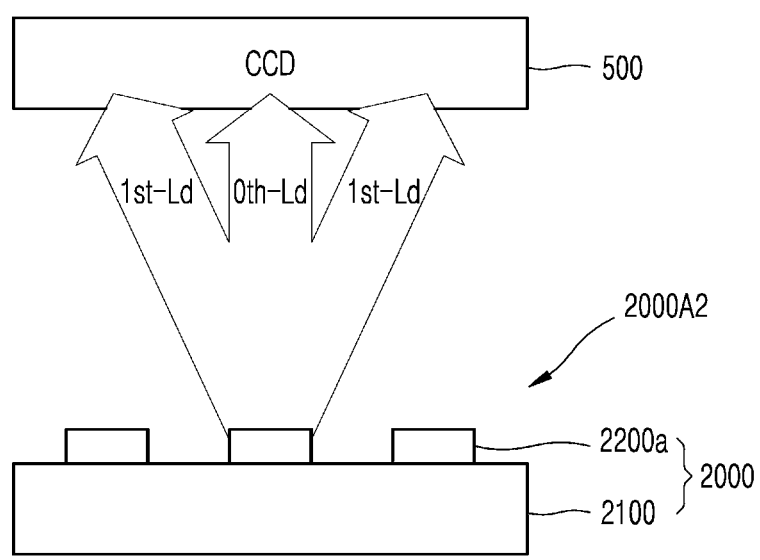

FIGS. 4A to 4C are conceptual diagrams illustrating a process of measuring a phase of an EUV mask by using the apparatus for measuring the phase of the EUV mask of FIG. 1. Description will be made with reference to FIGS. 1 to 3 and description previously given with reference to FIGS. 1 to 3 may be omitted in the interest of brevity.

Referring to FIG. 4A, first, by using the phase measuring apparatus 1000 according to the current embodiment, reflectivity Rml of the multilayer area MLA of the first mask pattern area 2000A1 of the EUV mask 2000 is measured. In FIG. 4A, for convenience sake, only the multilayer area MLA of the first mask pattern area 2000A1 is illustrated. Reflectivity R may be defined as the intensity of the reflected light to the intensity of the incident light as described above. Therefore, the reflectivity Rml of the multilayer area MLA may be calculated by measuring EUV light Lrm reflected from the multilayer area MLA through the detector 500 and dividing the intensity of the measured EUV light by intensity of the EUV light incident on the multilayer area MLA.

Referring to FIG. 4B, by using the phase measuring apparatus 1000 according to the current embodiment, reflectivity Rabs of the absorber layer area ALA of the first mask pattern area 2000A1 of the EUV mask 2000 is measured. In FIG. 4B, for convenience sake, the absorber layer area ALA of the first mask pattern area 2000A1 and only a part of the multilayer area MLA adjacent to the absorber layer area ALA of the first mask pattern area 2000A1 are illustrated. The reflectivity Rabs of the absorber layer area ALA may be obtained by the same method as a method of obtaining the reflectivity Rml of the multilayer area MLA. That is, the reflectivity Rabs of the absorber layer area ALA may be obtained by measuring EUV light Lra reflected from the absorber layer area ALA and dividing the intensity of the measured EUV light by the intensity of the EUV light incident on the absorber layer area ALA.

Referring to FIG. 4C, after obtaining the reflectivity Rml of the multilayer area MLA of the first mask pattern area 2000A1 and the reflectivity Rabs of the absorber layer area ALA of the first mask pattern area 2000A1, by using the phase measuring apparatus 1000 according to the current embodiment, the diffraction efficiency of the diffracted light from the pattern of the second absorber layer 2200a of the second mask pattern area 2000A2 of the EUV mask 2000 is measured. In more detail, the diffracted light reflected from the pattern of the second absorber layer 2200a of the second mask pattern area 2000A2 is measured through the detector 500 and the intensity of the measured diffracted light is calculated by component. For example, the intensity of the 0th order diffracted light 0th-Ld and the intensity of the first order diffracted light 1st-Ld are calculated. The diffraction efficiency may be defined as the intensity of the diffracted light of the pattern of the second absorber layer 2200a to the intensity of the reflected light of the multilayer area MLA. In addition, the diffraction efficiency may be obtained by component. For example, diffraction efficiency I0 of the 0th order diffracted light 0th-Ld may be obtained by dividing the intensity of the 0th order diffracted light 0th-Ld by the intensity of the reflected light of the multilayer area MLA. In addition, diffraction efficiency I1 of the first order diffracted light 1st-Ld may be obtained by dividing the intensity of the 1st order diffracted light 1st-Ld by the intensity of the reflected light of the multilayer area MLA.

Then, by using the reflectivity Rml of the multilayer area MLA, the reflectivity Rabs of the absorber layer area ALA, and diffraction efficiency of each of the components of the diffracted light, an absolute value of the phase of the EUV mask 2000 may be specifically calculated. On the other hand, the calculated phase of the EUV mask 2000 is similar to the phase of the actual EUV mask as described above. A principle of obtaining the absolute value of the phase of the EUV mask will be described in more detail with reference to FIG. 5.

Figure 5:
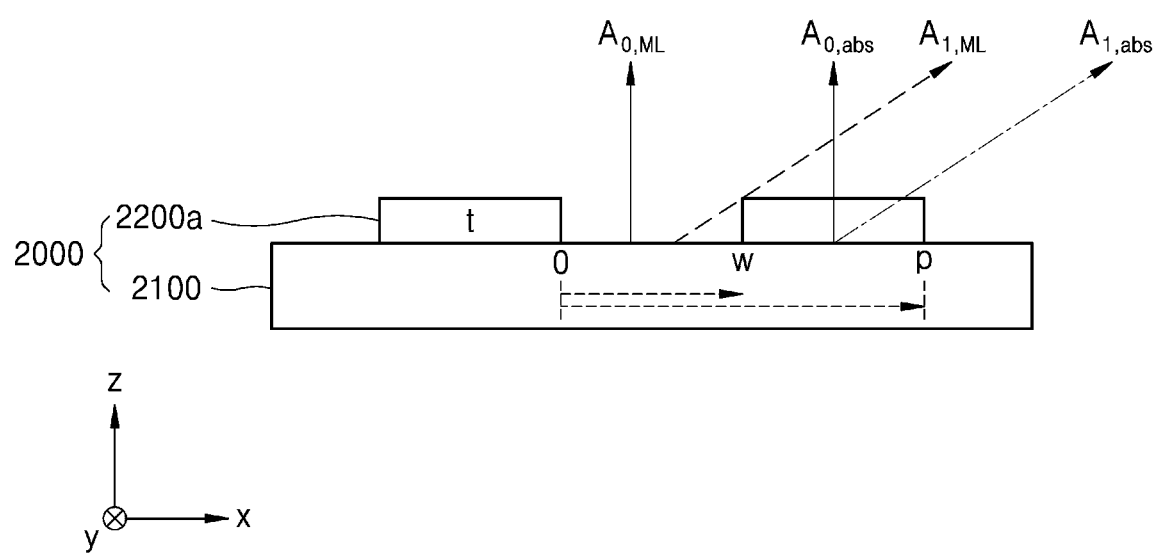
FIG. 5 is a conceptual diagram illustrating a principle of measuring a phase of an EUV mask by using the apparatus for measuring the phase of the EUV mask of FIG. 1.

FIG. 5 is a conceptual diagram illustrating a principle of measuring a phase of an EUV mask by using the apparatus for measuring the phase of the EUV mask of FIG. 1. Description previously given with reference to FIGS. 1 to 4C may be omitted in the interest of brevity.

Referring to FIG. 5, the EUV mask 2000 may include the multilayer 2100 and the second absorber layers 2200a. On the other hand, as illustrated in FIG. 5, the second absorber layer 2200a has repeated line and space patterns apart from each other in the first direction (the x direction) and extending in the second direction (the y direction). In FIG. 5, $A_{0,ML}$ and $A_{1,ML}$ may respectively mean 0th order diffracted light and first order diffracted light in the multilayer 2100 and $A_{0,abs}$ and $A_{1,abs}$ may mean 0th order diffracted light and first order diffracted light in the second absorber layer 2200a.

In accordance with a diffraction theory, when a thickness t of the second absorber layer 2200a is almost 0, the diffraction efficiency I0 of the $0^{th}$ order diffracted light and the diffraction efficiency I1 of the first order diffracted light in the patterns repeated lines and spaces may be represented by EQUATION 1 and EQUATION 2.

$$I0=[(w/p)^2+Rr((p-w)/p)^2+2w(p-w)/p^2(Rr)^{1/2}\cos\varphi] \quad \text{EQUATION (1)}$$

$$I1=1/\pi^2\sin^2(w\pi/p)[1+Rr-2Rr^{1/2}\cos\varphi] \quad \text{EQUATION (2)}$$

wherein, w may mean a distance between the patterns of the second absorber layer 2200a in the first direction (the x direction) or a width of the multilayer area MLA and p may mean a pitch of each of the patterns of the second absorber layer 2200a in the first direction (the x direction). In addition, Rr may mean a ratio Rabs/Rml of the reflectivity Rabs of the absorber layer area ALA or the dark area to the reflectivity Rml of the multilayer area MLA or the clear area and φ may mean the phase of the EUV mask 2000.

On the other hand, I0 and I1 may be calculated or determined by the phase measuring apparatus 1000 according to the current embodiment as described above. Therefore, by calculating or determining w and y simultaneously satisfying I0 and I1 through EQUATION 1 and EQUATION 2, the phase of the EUV mask 2000 may be calculated or determined. In addition, when w is measured and obtained by a measuring instrument by another method or w is previously grasped or known, by calculating φ by substituting w for EQUATION 1 and EQUATION 2, the phase of the EUV mask 2000 may be calculated.

On the other hand, when the distance between the patterns of the second absorber layer 2200a is ½ of the pitch of each of the patterns of the second absorber layer 2200a, that is, when w=p/2 is established, y may be represented by EQUATION 3.

$$\varphi = \cos^{-1}\{(4I0 - \pi^2 I1)/4(Rr)^{1/2}\} \quad \text{EQUATION (3)}$$

The phase measuring apparatus 1000 according to the current embodiment may measure the reflectivity Rml of the multilayer area MLA and the reflectivity Rabs of the absorber layer area ALA by using the first mask pattern area 2000A1 of the EUV mask 2000, may measure the diffraction efficiency values I0 and I1 of the diffracted light components by using the second mask pattern area 2000A2 of the EUV mask 2000, and may specifically calculate the phase of the EUV mask 2000 by applying the diffraction efficiency values I0 and I1 to EQUATION 1 and EQUATION 2 in accordance with the diffraction theory.

For reference, when the second absorber layer 2200a has the patterns repeated in the form of lines and spaces, because above second order diffracted light is insignificant, it is not necessary to consider the above second order diffracted light. However, when the second absorber layer 2200a has repeated patterns different from the patterns repeated in the form of lines and spaces, in accordance with the diffraction theory, equations for the diffraction efficiency different from EQUATION 1 and EQUATION 2 may be induced and the above second order diffracted light may be considered. Furthermore, when the second absorber layer 2200a does not have the repeated patterns, the equation for the diffracted efficiency may become more complicated.

Figure 6:
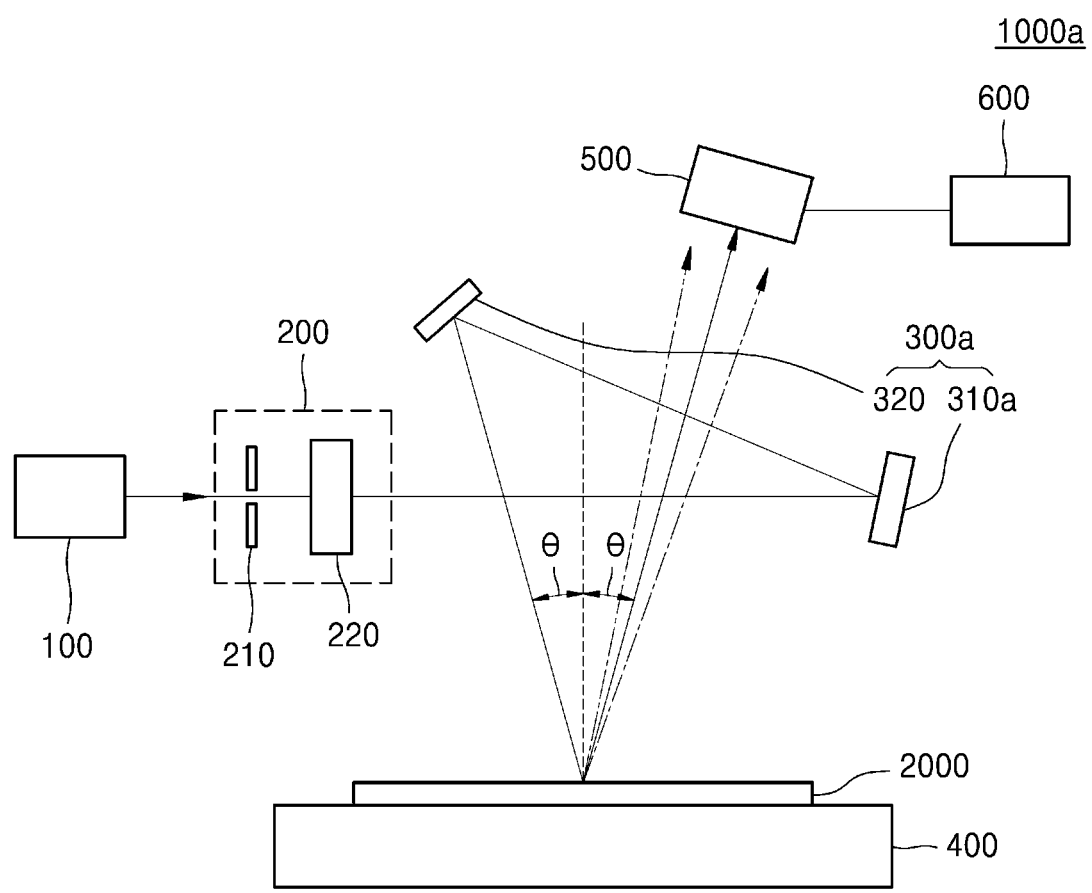
FIGS. 6 to 8 are block diagrams schematically illustrating an apparatus for measuring a phase of an extreme ultraviolet (EUV) mask according to embodiments of the inventive concept.
Figure 7:
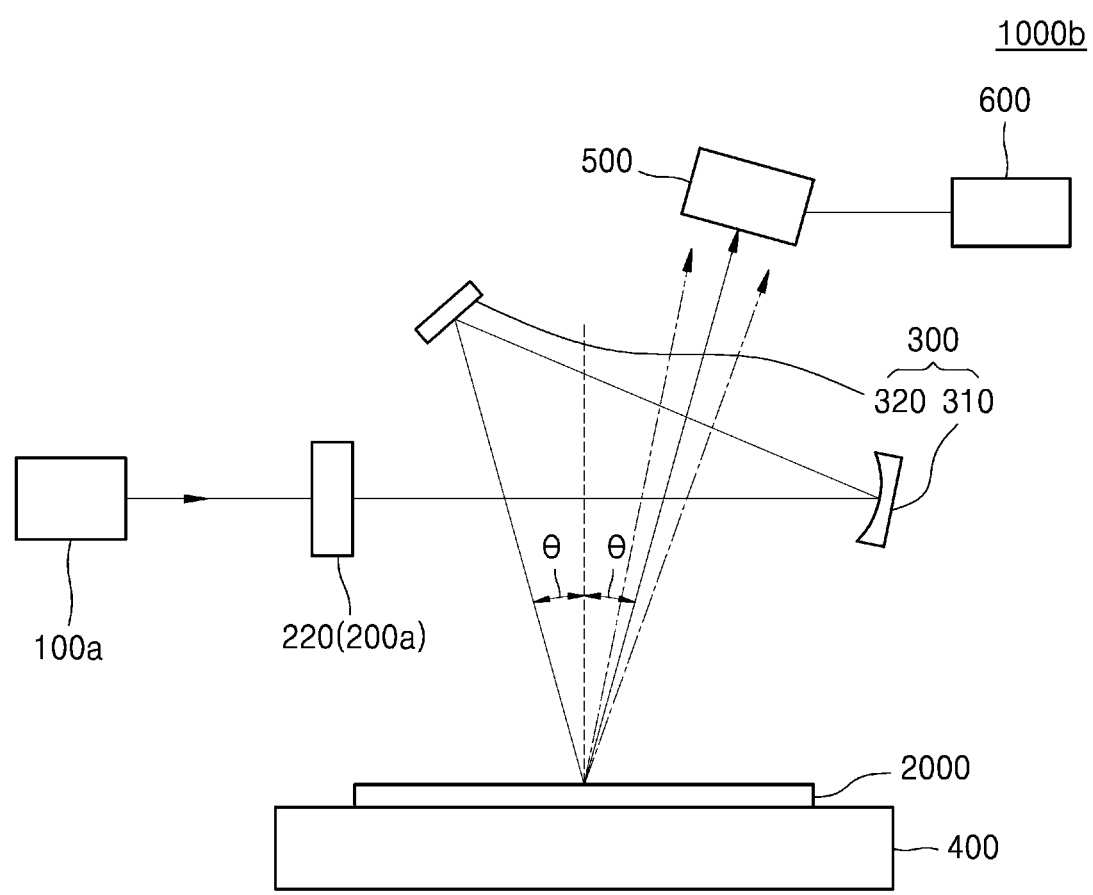
Figure 8:
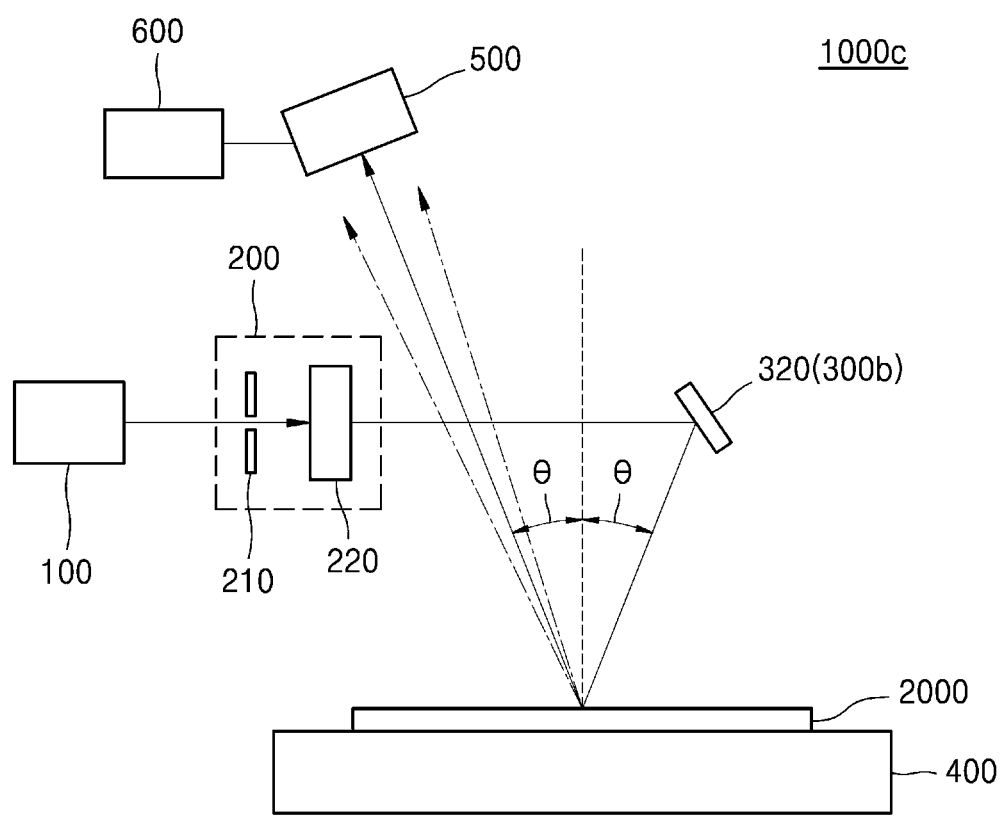

FIGS. 6 to 8 are block diagrams each schematically illustrating an apparatus for measuring a phase of an EUV mask according to embodiments of the inventive concept. Description previously given with reference to FIGS. 1 to 5 may be omitted in the interest of brevity.

Referring to FIG. 6, a phase measuring apparatus 1000a according to the current embodiment may be different from the phase measuring apparatus 1000 of FIG. 1 in a configuration of a mirror unit or mirror system 300a. Specifically, in the phase measuring apparatus 1000a according to the current embodiment, the mirror unit 300a includes a first mirror 310a and a second mirror 320 and the first mirror 310a may not be a concave mirror and may be a flat mirror like the second mirror 320. When the EUV light from the EUV light source 100 does not spread widely, condensing may not be required. Therefore, in the phase measuring apparatus 1000a according to the current embodiment, the first mirror 310a of the mirror unit 300a may be formed of the flat mirror.

Referring to FIG. 7, a phase measuring apparatus 1000b according to the current embodiment may be different from the phase measuring apparatus 1000 of FIG. 1 in configurations of an EUV light source 100a and a coherence unit or coherence system 200a. Specifically, in the phase measuring apparatus 1000b according to the current embodiment, the coherence unit 200a may include only a filter 220 and may not include a pin-hole plate. In addition, the EUV light source 100a may not be a common EUV light source and may be a coherent EUV light source outputting coherent EUV light. For example, the EUV light source 100a may be a high harmonic generation (HHG) EUV light source generating a higher order harmonic wave.

When the EUV light source 100a is a coherent EUV light source, considering that the pin-hole plate is arranged in order to improve spatial coherence of light, the pin-hole plate may not be required. Therefore, in the phase measuring apparatus 1000b according to the current embodiment, the coherence unit 200a may not include the pin-hole plate and may include only the filter 220. Although the EUV light source 100a is the coherent EUV light source, when it is necessary to reduce the size of the EUV light, a pin-hole plate in which a pin-hole with a corresponding size is formed may be arranged or provided.

Referring to FIG. 8, a phase measuring apparatus 1000c according to the current embodiment may be different from the phase measuring apparatus 1000 of FIG. 1 in a configuration of a mirror unit or mirror system 300b. Specifically, in the phase measuring apparatus 1000c according to the current embodiment, the mirror unit 300b may include only the second mirror 320 and may not include the first mirror. Therefore, the EUV light from the coherence unit 200 may be incident on the second mirror 320 and may be reflected from the second mirror 320 and directly incident on the EUV mask 2000 to be measured.

The second mirror 320 as the flat mirror may have actually the same function as the second mirror 320 of the phase measuring apparatus 1000 of FIG. 1. That is, the second mirror 320 may have the EUV light incident on the EUV mask 2000 with an angle θ of incidence of about 6°. According to an embodiment, the second mirror 320 may condense the EUV light and may have the condensed EUV light incident on the EUV mask 2000. In such a case, the second mirror 320 may have the form of the concave mirror.

In the phase measuring apparatus 1000c according to the current embodiment, in order to have the EUV light incident on the EUV mask 2000 with an angle θ of incidence of about 6°, the second mirror 320 may be arranged to be spaced apart from the EUV mask 2000 by a certain distance. However, in the phase measuring apparatus 1000c according to the current embodiment, only the second mirror 320 is arranged or provided, which may be advantageous in terms of optical loss.

Figure 9:
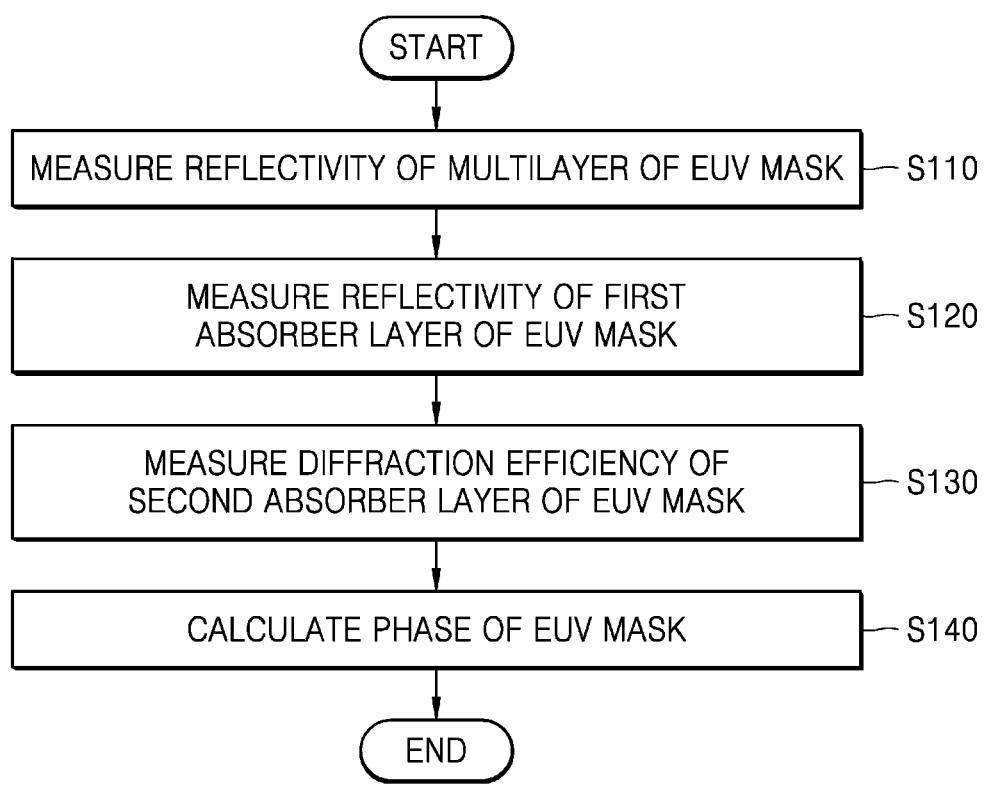
FIG. 9 is a flowchart illustrating processes of a method of measuring a phase of an EUV mask according to an embodiment of the inventive concept.

FIG. 9 is a flowchart illustrating processes of a method of measuring a phase of an EUV mask according to an embodiment of the inventive concept. Description will be made with reference to FIGS. 1 to 2B and description previously given with reference to FIGS. 1 to 8 may be omitted in the interest of brevity.

Referring to FIG. 9, in the method of measuring the phase of the EUV mask according to the current embodiment (hereinafter, referred to as 'a phase measuring method'), first, by using the phase measuring apparatus 1000, the reflectivity of the multilayer 2100 or the multilayer area MLA of the first mask pattern area 2000A1 of the EUV mask 2000 is measured in operation S110. The reflectivity of the multilayer 2100 may be calculated by measuring the EUV light reflected from the multilayer 2100 through the detector 500 and dividing the intensity of the measured EUV light by the intensity of the EUV light incident on the multilayer 2100 based on the definition of the reflectivity.

Next, by using the phase measuring apparatus 1000, the reflectivity of the first absorber layer 2200 or the absorber layer area ALA of the first mask pattern area 2000A1 of the EUV mask 2000 is measured in operation S120. The reflectivity of the first absorber layer 2200 may be calculated by measuring the EUV light reflected from the first absorber layer 2200 through the detector 500 and dividing the intensity of the measured EUV light by the intensity of the EUV light incident on the first absorber layer 2200 in the same way as calculating the reflectivity of the multilayer 2100.

Then, by using the phase measuring apparatus 1000, the diffraction efficiency of each of the patterns of the second absorber layer 2200a of the second mask pattern area 2000A2 of the EUV mask 2000 is measured in operation S130. The diffraction efficiency may be calculated by dividing the intensity of the diffracted light from each of the patterns of the second absorber layer 2200a by the intensity of the EUV light reflected from the multilayer 2100. In addition, the diffraction efficiency may be calculated by each component of the diffracted light. For example, the diffraction efficiency I0 of the 0th order diffracted light may be calculated by dividing the intensity of the 0th order diffracted light by the intensity of the EUV light reflected from the multilayer 2100. In addition, the diffraction efficiency I1 of the first order diffracted light may be calculated by dividing the intensity of the first order diffracted light by the intensity of the EUV light reflected from the multilayer 2100.

In FIG. 9, operations are performed in the order of operation S110 of measuring the reflectivity of the multilayer, operation S120 of measuring the reflectivity of the first absorber layer, and operation S130 of measuring the diffraction efficiency of each of the patterns of the second absorber layer. However, the inventive concept is not limited thereto. For example, operations may be independently performed and the order in which operations are performed may be arbitrary.

After measuring the reflectivity of each of the multilayer 2100 and the first absorber layer 2200 of the EUV mask 2000 and measuring the diffraction efficiency of each of the patterns of the second absorber layer 2200a, the phase of the EUV mask 2000 is calculated in operation S140. The phase of the EUV mask 2000 may be calculated by applying the measured reflectivity and diffraction efficiency to EQUATION 1 and EQUATION 2 in accordance with the diffraction theory. For example, when the patterns of the second absorber layer 2200a of the EUV mask 2000 are repeated in the form of lines and spaces, a distance between the patterns of the second absorber layer 2200a is w, and a pitch of each of the patterns of the second absorber layer 2200a is p, the diffraction efficiency I0 of the 0th order diffracted light and the diffraction efficiency I1 of the first order diffracted light are represented by EQUATION 1 and EQUATION 2 and, by obtaining y simultaneously satisfying EQUATION 1 and EQUATION 2 or by obtaining y by applying measured or previously grasped or known w to EQUATION 1 and EQUATION 2, the phase of the EUV mask 2000 may be calculated. Furthermore, the calculated phase of the EUV mask 2000 is similar to the phase of the actual EUV mask and may contribute to determining whether the phase of the actual EUV mask is defective as described above.

Figure 10:
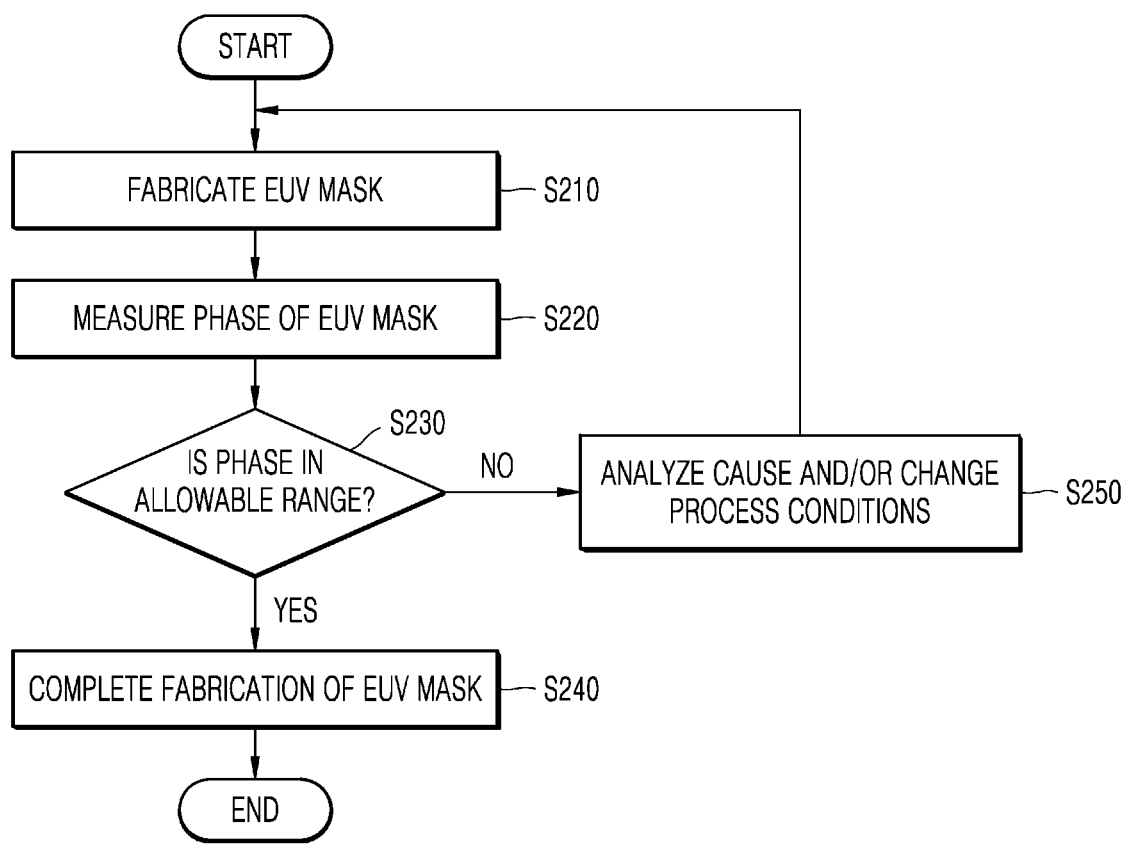
FIG. 10 is a flowchart illustrating processes of a method of fabricating an EUV mask according to an embodiment of the inventive concept.

FIG. 10 is a flowchart illustrating processes of a method of fabricating an EUV mask according to an embodiment of the inventive concept. Description will be made with reference to FIGS. 1 to 2B and description previously given with reference to FIG. 9 may be omitted in the interest of brevity.

Referring to FIG. 10, in the method of fabricating the EUV mask according to the current embodiment, first, the EUV mask is fabricated in operation S210. The EUV mask may be fabricated by a method of fabricating a common EUV mask. For example, the EUV mask may be fabricated by performing a layout design of a pattern on a mask, by obtaining design data on a mask through an OPC method, by transmitting mask tape-out (MTO) design data, by preparing mask data, by exposing a mask substrate, and by performing a subsequent process.

Then, the phase of the EUV mask is measured in operation S220. The phase of the EUV mask may not be measured by measuring the phase of the previously fabricated actual EUV mask and may be measured by using the first mask pattern area 2000A1 and the second mask pattern area 2000A2 of the EUV mask 2000 as described for the phase measuring method of FIG. 9. The detailed method of measuring the phase of the EUV mask is the same as described with reference to FIG. 9.

Next, it is determined whether the measured phase of the EUV mask is in an allowable range in operation S230. In general, the EUV mask must have a required phase. However, when a material or pattern of each of the first and second absorber layers 2200 and 2200a is defective, the EUV mask may not have the required phase. On the other hand, defects in the pattern of each of the first and second absorber layers 2200 and 2200a may be caused by a process error when the pattern of each of the first and second absorber layers 2200 and 2200a is formed. Therefore, by measuring the phase of the EUV mask 2000 through the phase measuring method of FIG. 9, the phase of the actual EUV mask may be indirectly measured. As described above, the phase of the EUV mask 2000 may be similar to the phase of the actual EUV mask.

For reference, the EUV mask 2000 may be different from the actual EUV mask in scale and materials of the multilayer 2100 and the first and second absorber layers 2200 and 2200a may be the same as materials of the multilayer and the absorber layers of the actual EUV mask and fabrication processes of the EUV mask 2000 may be the same as fabrication processes of the actual EUV mask. Therefore, during fabrication of the actual EUV mask, when a material or process condition of each of absorber layers is erroneous so that the phase of the actual EUV mask deviates from an allowable range, the same error may occur in the EUV mask 2000 and the measured phase may also deviate from the allowable range.

When the calculated phase is in the allowable range (Yes), fabrication of the EUV mask is completed in operation S240. When the calculated phase deviates from the allowable range (No), a cause is analyzed and/or process conditions are changed in operation S250. Here, the process conditions may include the materials of the multilayer 2100 and the first and second absorber layers 2200 and 2200a. Then, the process returns to operation S210 of fabricating the EUV mask, and a new EUV mask is fabricated based on the changed process conditions.

The method of fabricating the EUV mask according to the current embodiment may significantly contribute to improvement of quality of the EUV mask by correctly measuring the phase of the EUV mask through the phase measuring method described with reference to FIG. 9 and determining whether the phase of the EUV mask is defective.

While the inventive concept has been particularly shown and described with reference to embodiments thereof, it will be understood that various changes in form and details may be made therein without departing from the scope of the following claims.

What is claimed is:

1. A method of measuring a phase of an extreme ultraviolet (EUV) mask, the method comprising:
    measuring reflectivity of a multilayer of a first mask pattern area of an EUV mask to be measured using a phase measuring apparatus;
    measuring reflectivity of an absorber layer of the first mask pattern area using the phase measuring apparatus;
    measuring diffraction efficiency of patterns of an absorber layer of a second mask pattern area of the EUV mask using the phase measuring apparatus; and
    determining a phase of the EUV mask using the reflectivity of each of the multilayer and the absorber layer of the first mask pattern area and the diffraction efficiency of the patterns of the absorber layer of the second mask pattern area.

2. The method of claim 1, wherein the phase measuring apparatus comprises:
    an EUV light source configured to generate and output EUV light;
    at least one mirror configured to reflect the EUV light as reflected EUV light incident on the EUV mask;
    a mask stage on which the EUV mask is arranged;
    a detector configured to receive the EUV light reflected from the EUV mask, to obtain a two-dimensional (2D) image, and to measure reflectivity and diffraction efficiency of the EUV mask; and
    a processor configured to calculate a phase of the EUV mask using the reflectivity and diffraction efficiency of the EUV mask.

3. The method of claim 2, wherein the order in which the measuring of the reflectivity of the multilayer of the first mask pattern area, the measuring the reflectivity of the absorber layer of the first mask pattern area, and the measuring of the diffraction efficiency of the patterns of the absorber layer of the second mask pattern area are performed is arbitrary,
    wherein, in the measuring of the reflectivity of the multilayer of the first mask pattern area, the detector receives reflected light of the multilayer of the first mask pattern area and measures the reflectivity of the multilayer of the first mask pattern area,
    wherein, in the measuring of the reflectivity of the absorber layer of the first mask pattern area, the detector receives reflected light of the absorber layer of the first mask pattern area and measures the reflectivity of the absorber layer of the first mask pattern area,
    wherein, in the measuring of the diffraction efficiency of the patterns of the absorber layer of the second mask pattern area, the detector receives diffracted light from the patterns of the absorber layer of the second mask pattern area and measures the diffraction efficiency using the reflected light of the multilayer of the first mask pattern area, and
    wherein the diffraction efficiency is represented as a ratio of intensity of the diffracted light to intensity of the reflected light of the multilayer.

4. The method of claim 3, wherein the patterns of the absorber layer of the second mask pattern area comprise line and space patterns,
    wherein, when a width of each of spaces of the patterns of the absorber layer of the second mask pattern area is w and a pitch of each of the patterns of the absorber layer of the second mask pattern area is p,
    diffraction efficiency I0 of 0th order diffracted light and diffraction efficiency I1 of first order diffracted light are represented by EQUATION 1 and EQUATION 2, $$I0=[(w/p)^2+Rr((p-w)/p)^2+2w(p-w)/p^2(Rr)^{1/2}\cos\varphi] \quad \text{EQUATION (1)}$$

$$I1=1/\pi^2\sin^2(w\pi/p)[1+Rr-2Rr^{1/2}\cos\varphi] \quad \text{EQUATION (2), and}$$

wherein Rr means a ratio of reflectivity of the absorber layer to reflectivity of the multilayer and $\varphi$ means a phase of the EUV mask.

5. The method of claim 4, wherein w and $\varphi$ simultaneously satisfying the measured diffraction efficiency values I0 and I1 are calculated or the $\varphi$ is calculated by measuring the w and substituting the measured w for EQUATION 1 and EQUATION 2.

6. The method of claim 2, wherein the at least one mirror comprises a first mirror and a second mirror,
    wherein the first mirror is configured to reflect the EUV light from the EUV light source and to focus the reflected EUV light onto the second mirror, and
    wherein the second mirror is configured to reflect the EUV light from the first mirror with the reflected EUV light incident on the EUV mask to be measured with an angle of incidence of 6°.

7. A method of fabricating an extreme ultraviolet (EUV) mask, the method comprising:
    fabricating a first EUV mask;
    measuring reflectivity of a multilayer of a first mask pattern area of a second EUV mask to be measured using a phase measuring apparatus;
    measuring reflectivity of an absorber layer of the first mask pattern area using the phase measuring apparatus;
    measuring diffraction efficiency of patterns of an absorber layer of a second mask pattern area of the second EUV mask using the phase measuring apparatus;
    calculating a phase of the first EUV mask using the reflectivity of each of the multilayer and the absorber layer and the diffraction efficiency of the patterns of the absorber layer;
    determining whether the calculated phase is in an allowable range; and
    completing fabrication of the first EUV mask when the phase is in the allowable range.

8. The method of claim 7, wherein the phase measuring apparatus comprises:
    an EUV light source configured to generate and output EUV light;
    at least one mirror configured to reflect the EUV light as reflected EUV light incident on the second EUV mask;
    a mask stage on which the second EUV mask is arranged;
    a detector configured to receive the EUV light reflected from the second EUV mask, to obtain a two-dimensional (2D) image, and to measure reflectivity and diffraction efficiency of the second EUV mask; and
    a processor configured to calculate a phase of the first EUV mask by using the reflectivity and diffraction efficiency of the second EUV mask.

9. The method of claim 8, wherein the order in which the measuring of the reflectivity of the multilayer, the measuring the reflectivity of the absorber layer, and the measuring of the diffraction efficiency of the patterns of the absorber layer are performed is arbitrary,
    wherein, in the measuring of the reflectivity of the multilayer, the detector receives reflected light of the multilayer of the first mask pattern area and measures the reflectivity of the multilayer, wherein, in the measuring of the reflectivity of the absorber layer, the detector receives reflected light of the absorber layer of the first mask pattern area and measures the reflectivity of the absorber layer, wherein, in the measuring of the diffraction efficiency of the patterns of the absorber layer, the detector receives diffracted light from the patterns of the absorber layer of the second mask pattern area and measures the diffraction efficiency using the reflected light of the multilayer, and wherein the diffraction efficiency is represented as a ratio of intensity of the diffracted light to intensity of the reflected light of the multilayer.

10. The method of claim 9, wherein the patterns of the absorber layer of the second mask pattern area comprise line and space patterns, wherein, when a width of each of spaces of the patterns of the absorber layer of the second mask pattern area is w and a pitch of each of the patterns of the absorber layer of the second mask pattern area is p, diffraction efficiency I0 of 0th order diffracted light and diffraction efficiency I1 of first order diffracted light are represented by EQUATION 1 and EQUATION 2, $$I0=[(w/p)^2+Rr((p-w)/p)^2+2w(p-w)/p^2(Rr)^{1/2}\cos\varphi] \quad \text{EQUATION (1)}$$

$$I1=1/\pi^2 \sin^2(w\pi/p)[1+Rr-2Rr^{1/2}\cos\varphi] \quad \text{EQUATION (2), and}$$

wherein Rr means a ratio of reflectivity of the absorber layer to reflectivity of the multilayer and $\varphi$ means the phase of the second EUV mask.

11. The method of claim 10, wherein w and $\varphi$ simultaneously satisfying the measured I0 and I1 are calculated or the $\varphi$ is calculated by measuring the w and substituting the measured w for EQUATION 1 and EQUATION 2.

12. The method of claim 8, wherein the at least one mirror comprises a first mirror and a second mirror, wherein the first mirror is configured to reflect the EUV light from the EUV light source and focus the reflected EUV light onto the second mirror, and wherein the second mirror is configured to reflect the EUV light from the first mirror as the reflected EUV light incident on the second EUV mask to be measured with an angle of incidence of 6°.

* * * * *